United States Patent
Mohanasundaram et al.

(10) Patent No.: US 11,877,420 B2
(45) Date of Patent: Jan. 16, 2024

(54) HPC COMPUTING UNIT COMPRISING A TOP TRAY COMPRISING SECONDARY ELECTRONIC COMPONENTS

(71) Applicant: BULL SAS, Les Clayes-sous-Bois (FR)

(72) Inventors: Sakthivel Mohanasundaram, Thanjavur (IN); Mohanakumara Prakasha, Karnataka (IN)

(73) Assignee: BULL SAS, Les Clayes-sous-bois (FR)

( * ) Notice: Subject to any disclaimer, the term of this patent is extended or adjusted under 35 U.S.C. 154(b) by 0 days.

(21) Appl. No.: 17/722,469

(22) Filed: Apr. 18, 2022

(65) Prior Publication Data

US 2022/0346264 A1 Oct. 27, 2022

(30) Foreign Application Priority Data

Apr. 27, 2021 (EP) ..................................... 21170745

(51) Int. Cl.
- *H05K 7/00* (2006.01)
- *H05K 7/14* (2006.01)
- *H05K 5/02* (2006.01)

(52) U.S. Cl.
CPC ......... *H05K 7/1489* (2013.01); *H05K 5/0221* (2013.01); *H05K 5/0286* (2013.01); *H05K 7/1487* (2013.01)

(58) Field of Classification Search
None
See application file for complete search history.

(56) References Cited

U.S. PATENT DOCUMENTS

| | | | | |
|---|---|---|---|---|
| 9,491,884 B2* | 11/2016 | Chung | ................. | H05K 7/1487 |
| 9,763,350 B2* | 9/2017 | Rust | ..................... | G11B 33/126 |
| 10,064,305 B1* | 8/2018 | Zhai | ..................... | H05K 7/1425 |
| 10,165,703 B1* | 12/2018 | Adrian | ................ | H05K 7/1491 |
| 10,274,998 B2* | 4/2019 | Hesse | ................ | H01R 12/7005 |
| 11,150,707 B2* | 10/2021 | Song | ...................... | G06F 1/187 |
| 11,439,045 B2* | 9/2022 | Korolenko | ......... | H05K 7/20727 |
| 2010/0172087 A1* | 7/2010 | Jeffery | ................ | G11B 33/128 |
| | | | | 361/679.48 |
| 2017/0083057 A1* | 3/2017 | Bettiga | .................. | G06F 1/185 |
| 2020/0120828 A1* | 4/2020 | Luo | ...................... | H05K 7/1489 |
| 2021/0209718 A1* | 7/2021 | Song | .................... | H05K 5/0026 |

OTHER PUBLICATIONS

European Search Report issued in EP21170745.0, dated Nov. 3, 2021 (4 pages).

* cited by examiner

*Primary Examiner* — Anthony Q Edwards
*Assistant Examiner* — Rashen E Morrison
(74) *Attorney, Agent, or Firm* — ARC IP Law, PC; Joseph J. Mayo (57) ABSTRACT

A computing unit configured to be mounted in a HPC cabinet comprising an external body and an internal body. The internal body includes a bottom tray, bottom secondary electronic components, at least a bottom connector connected to the bottom secondary electronic components and a top tray being releasably coupled with the bottom tray. The top tray includes top secondary electronic components and at least a top connector connected to the top secondary electronic components, wherein the top connector is configured to cooperate with the bottom connector when the top tray is coupled with the bottom tray.

13 Claims, 5 Drawing Sheets

HPC COMPUTING UNIT COMPRISING A TOP TRAY COMPRISING SECONDARY ELECTRONIC COMPONENTS

This application claims priority to European Patent Application Number 21170745.0, filed 27 Apr. 2021, the specification of which is hereby incorporated herein by reference.

BACKGROUND OF THE INVENTION

Field of the Invention

Embodiments of the invention relate, in general, to a high-performance computing and, more specifically, to a computing unit for a high-performance computing cabinet.

A datacenter comprises several high-performance computing cabinets, called HPC cabinets or "clusters", arranged in rows within the datacenter and configured to house computing units, such as servers, switches and routers, to organize, process and store data. Each computing unit comprises conventionally at least one mother board and several components secured to the mother board such as processors, Dual In-Line Memory Module (DIMM), a PCIe component (GPU, FPGAs)), fans, etc.

High performance computing has gained importance in recent years by several industries which are trending towards increasing sizes or combinations of two or more servers to achieve faster processing performance for a large number of processing operations. Solutions known to address such requirement of the industries include Ultra Path Interconnect (UPI) technology which provides a scalable multiprocessor system, for example, by linking motherboards of two or more computing units together. However, users face several issues which either require a maintenance activity to be carried out on the computing units and may often include replacement of few components in the computing units.

A HPC cabinet comprises traditionally two vertical side walls delimiting a central cavity with a front opening, so as to define vertically stacked sockets having a standard height (U). A computing unit is configured to be housed in the HPC cabinet and mounted onto the two vertical side walls. The height of the computing device is usually comprised between 1 U and 6 U.

Each vertical side wall comprises a front portion which is configured to cooperate with an abutment wall of the computing unit. Usually, the front portion of each side wall comprises threaded openings and the abutment wall of the computing unit comprises screws which are configured to be screwed into the threaded openings so that the computing unit is secured fixedly to the HPC cabinet. Besides its mechanical mounting, each computing unit is also connected to a power distribution unit, known as PDU, and to a network thanks to a management node (not represented) located within the HPC cabinet.

A computing unit comprises generally a bottom tray on which are mounted the components and a top tray comprising ventilation ducts so that fresh air, coming from the front, can be delivered to the rear of the computing unit.

The bottom tray can receive several components such as expansion cards comprising a GPU (Graphical Processing Unit). However, the expansion cards are becoming larger. The FHFL format (Full Height Full Length) is becoming more and more popular. In current computing units, it is not possible to mount at the same time processors, memory cards and expansion cards.

In order to overcome such a drawback, a first solution would be to provide a computing unit dedicated for receiving FHFL expansion cards but it is uneconomic. A second solution would be to increase the height of the computing unit in order to mound the expansion cards vertically. Such a solution would decrease the number of computing units which can be mounted in a HPC cabinet, which is a drawback for customers.

Accordingly, it is one object of one or more embodiments of the invention to provide a computing unit in which a FHFL expansion card can be mounted and replaced effortlessly.

BRIEF SUMMARY OF THE INVENTION

The invention relates to a computing unit configured to be mounted in a High-Performance Computing cabinet, thereafter HPC cabinet, defining a plurality of vertically stacked sockets, the computing unit according to one or more embodiments comprising:
  an external body, comprising primary electronic components, configured to engage with at least one of the sockets, the external body comprising at least a bottom wall and two lateral walls defining a housing opened from the front, each lateral side comprising an abutment wall configured to be secured directly to the HPC cabinet, the external body comprising at least a first connector connected to the primary electronic components,
  an internal body, comprising secondary electronic components, the internal body being releasably coupled with the external body in order to allow extraction of the internal body when the external body is secured fixedly to the HPC cabinet, the internal body comprising at least a second connector connected to the secondary electronic components, the second connector being configured to cooperate with the first connector when the internal body is coupled with the external body,
  the internal body comprising:
    a bottom tray, comprising bottom secondary electronic components and at least a bottom connector connected to the bottom secondary electronic components,
    a top tray being releasably coupled with the bottom tray, the top tray comprising top secondary electronic components and at least a top connector connected to the top secondary electronic components, the top connector being configured to cooperate with the bottom connector when the top tray is coupled with the bottom tray.

In at least one embodiment of the invention, the top tray is used for guiding air flow but also for mounting top secondary electronic components which are very large such as FLFH format. The top tray is connected electronically to the bottom tray so that all secondary electronic components can be connected to primary electronic components mounted in the external body. The computing unit has a high modularity and a top secondary electronic component can be removed without removing the external body from an HPC cabinet.

According to one or more embodiments, at least one of the top secondary electronic components is an expansion card, extending longitudinally in the computing unit from the front to the rear, and another one of the top secondary electronic components is an interface card connected to the top connector. The expansion card is connected to the interface card thanks to a lateral connection. Such an expansion card can use the entire length of the top tray which is advantageous for a FHFL format.

In at least one embodiment, the top tray comprises a fastening system, independent from the lateral connection, coupling mechanically the expansion card to the top tray. Such a fastening allows guiding the expansion card to protect the lateral connection.

According to one or more embodiments of the invention, the fastening system is configured to guide the expansion card relatively to the interface card along a guiding path formed in the top tray. In at least one embodiment, the guiding path comprises at least a lateral slot. The expansion card is guided mechanically without increasing the size of the computing unit or the top tray.

According to one or more embodiments of the invention, the fastening system comprises at least one fastening member for locking the expansion card with the top tray, preferably two. In at least one embodiment, at least one fastening member is a thumbscrew. Such a fastening member doesn't require a user to use tools for removing the expansion card. In one or more embodiments, the fastening portion comprises a foot portion which is guided within the lateral slot.

According to at least one embodiment of the invention, the fastening system comprises at least a supporting frame comprising a horizontal portion, configured to cooperate with the top tray, and a vertical portion, configured to cooperate with the expansion card. In at least one embodiment, the fastening system comprises locking members which are locking the vertical portion to the expansion card.

According to one or more embodiments of the invention, the expansion card has a Full-Length Full Height format. In at least one embodiment, the expansion card is connected to the interface card thanks to a lateral PCIe connection. The computing unit comprises at least two expansion cards.

At least one embodiment of the invention relates also to a method for removing an expansion card from the top tray of the internal body of a computing unit, presented before, the expansion card being connected to the interface card thanks to a lateral connection, the method comprising:
  Pulling the internal body out from the housing of the external body,
  Unlocking the fastening system,
  Moving laterally with guidance the expansion card away from the interface card and
  Removing vertically the expansion card.

BRIEF DESCRIPTION OF DRAWINGS

A better understanding of embodiments of the invention (including alternatives and/or variations thereof) may be obtained with reference to the detailed description of the embodiments along with the following drawings, in which.

DETAILED DESCRIPTION OF THE INVENTION

Reference will now be made in detail to specific embodiments or features, examples of which are illustrated in the accompanying drawings. Wherever possible, corresponding or similar reference numbers will be used throughout the drawings to refer to the same or corresponding parts. Moreover, references to various elements described herein are made collectively or individually when there may be more than one element of the same type. However, such references are merely exemplary in nature. It may be noted that any reference to elements in the singular may also be construed to relate to the plural and vice-versa without limiting the scope of the invention to the exact number or type of such elements unless set forth explicitly in the appended claims.

According to one or more embodiments, a datacenter comprises several high-performance computing cabinets, called HPC cabinets or "clusters", arranged in rows within the datacenter and configured to house computing units, such as servers, switches and routers, to organize, process and store data. A HPC cabinet is configured to accommodate multiple server units, switches, cords and cables, rails, cable management bars, routers, path panels, and blanking panels.

High performance computing has gained importance in recent years by several industries which are trending towards increasing sizes or combinations of two or more servers to achieve faster processing performance for a large number of processing operations. Solutions known to address such requirement of the industries include Ultra Path Interconnect (UPI) technology which provides a scalable multiprocessor system, for example, by linking motherboards of two or more computing units together.

Figure 1:
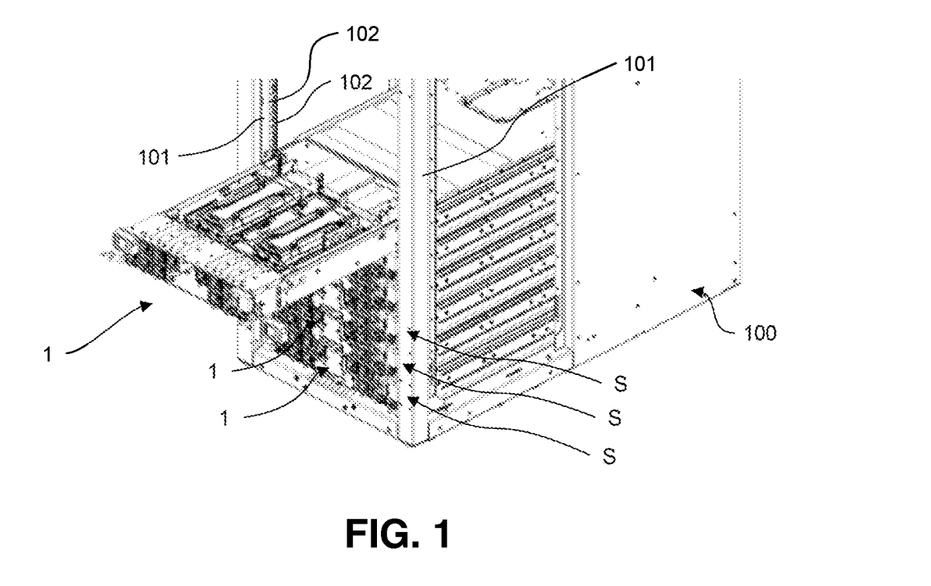
FIG. 1 is an isometric view of a HPC cabinet comprising several computing units, according to one or more embodiments of the invention.

As illustrated in FIG. 1, according to one or more embodiments, a HPC cabinet 100 comprises two vertical side walls 101, delimiting a central cavity with a front opening, so as to define vertically stacked sockets S having a standard height (U). Several computing units 1 are housed in the HPC cabinet 100 and mounted onto the two vertical side walls 101. In at least one embodiment, the height of each computing device 1 is 2 U but could be different.

Each vertical side wall 101 comprises a front portion which is configured to cooperate with an abutment wall of a computing unit 1. In at least one embodiment, the front portion of each side wall 101 comprises threaded openings 102. Such an HPC cabinet 100 is known from the prior art and won't be further detailed.

Figure 2:
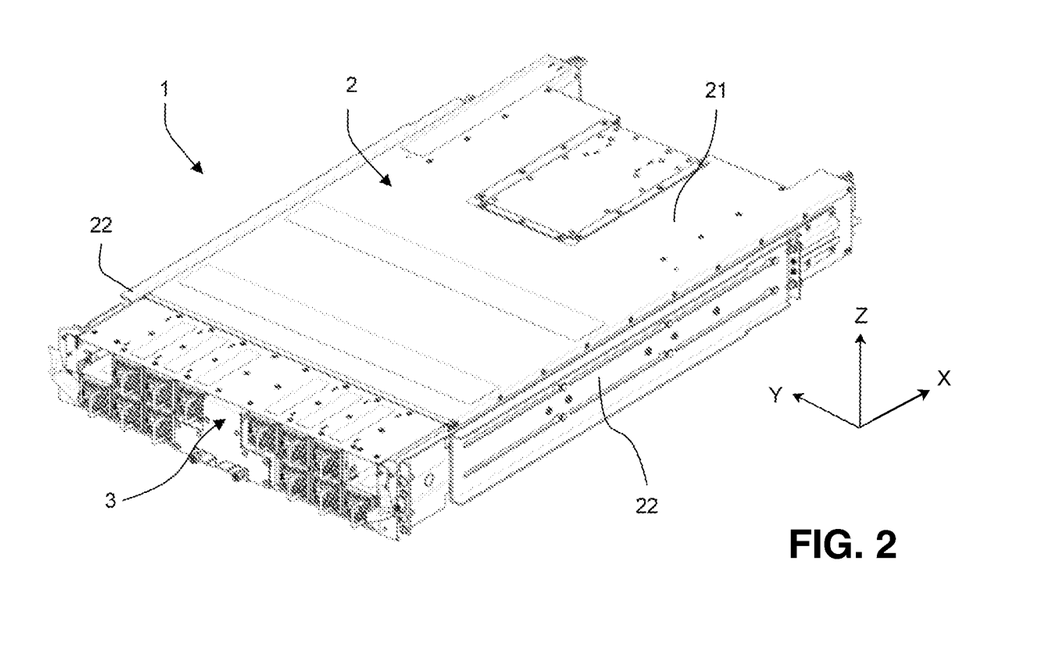
FIG. 2 is an isometric view of a computing unit, according to one or more embodiments of the invention.
Figure 3:
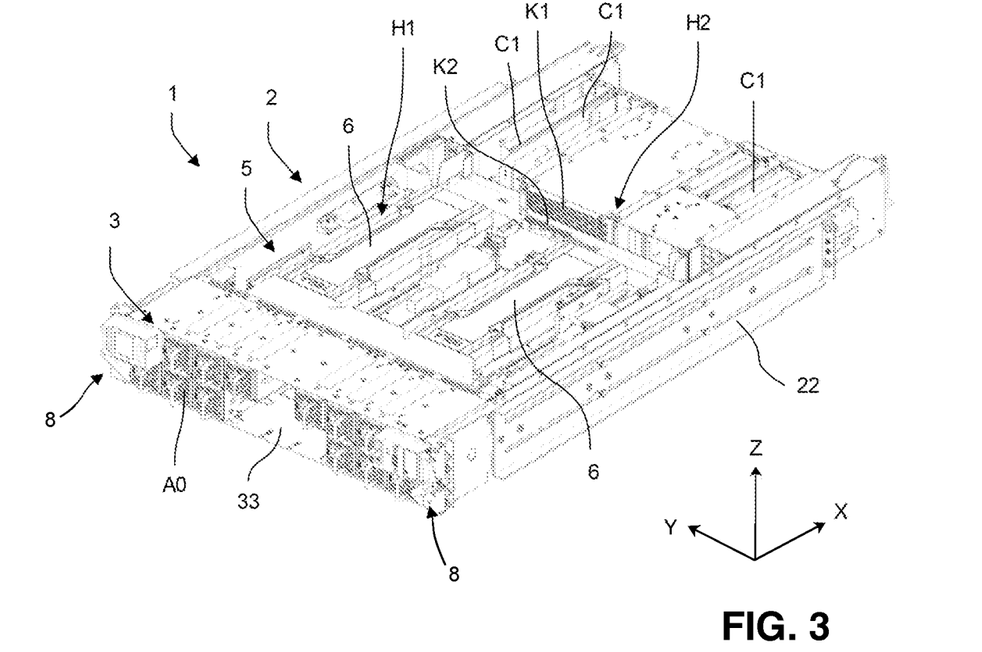
FIG. 3 is an isometric view of the computing unit from FIG. 2 without the top wall of the external body, according to one or more embodiments of the invention.
Figure 4:
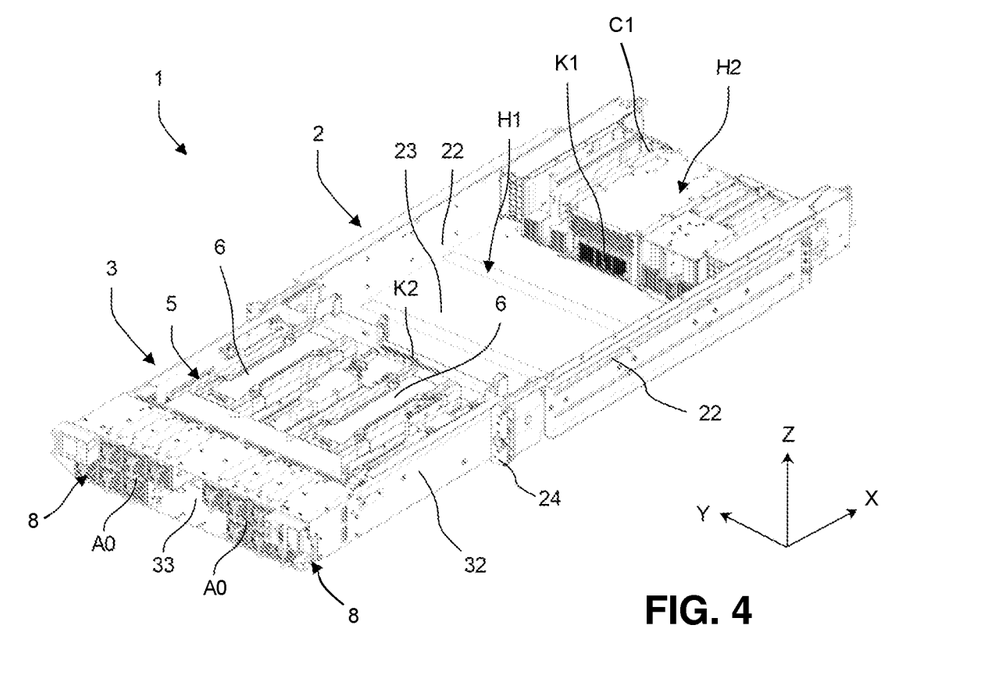
FIG. 4 is an isometric view of the computing from FIG. 3 with the internal body in the extracted position, according to one or more embodiments of the invention.

A computing unit 1 according to one or more embodiments of the invention will be now presented. In at least one embodiment, as represented in FIGS. 2, 3 and 4, the computing unit 1 comprises an internal body 3 mounted within an external body 2, the internal body 3 being releasably coupled to the external body 2 in order to allow extraction of the internal body 3 when the external body 2 is fixedly secured to the HPC cabinet 100. As illustrated in FIGS. 2 to 4, according to one or more embodiments, the computing unit 1 is presented in the (X, Y, Z) referential in which the X axis extends longitudinally from the front to the rear, the Y axis extends laterally from the right to the left and the Z axis extends vertically from the bottom to the top.

According to at least one embodiment of the invention, as represented in FIG. 2, the external body 2 comprise lateral walls 22, a bottom wall 23 (see FIG. 4) and a top wall 21 defining together a housing (the top wall 21 is not represented in the FIGS. 3 and 4). As represented in FIG. 4, by way of one or more embodiments, the external body 2 defines a front housing H1 where the internal body 3 can be mounted and a back housing H2 where primary electronic components C1 are located, for example, at least one mother board and components secured to the mother board such as processors, Dual In-Line Memory Module (DIMM), etc. The internal body 3 is configured to be releasably coupled to the primary electronic components C1 of the back housing H2. The external body 2 comprises at least a first connector K1 connected to the primary electronic components C1. The first connector K1 is located at the interface between the first housing H1 and the second housing H2.

As represented in FIG. 4, according to one or more embodiments, each lateral wall 22 of the external body 2 comprises an abutment wall 24 configured to be connected to the HPC cabinet 100, for example, by screws. Each abutment wall 24 is located in a front end of the external body 2. In at least one embodiment, as represented in FIG. 4, the computing unit 1 comprises, at each side of the internal body 3, a front lever 8 pivotally coupled to the internal body 3 for releasably coupling the internal body 3 with the external body 2. The coupling means could be different.

The internal body 3 comprises at least a second connector K2 connected to secondary electronic components of the internal body 3, the second connector K2 being configured to cooperate with the first connector K1 of the external body 2 when the internal body 3 is coupled with the external body 2 (See FIG. 3). The second connector K2 is located at the rear end of the internal body 3, preferably, at the rear end of the bottom tray 4 as it will be presented later.

Figure 5:
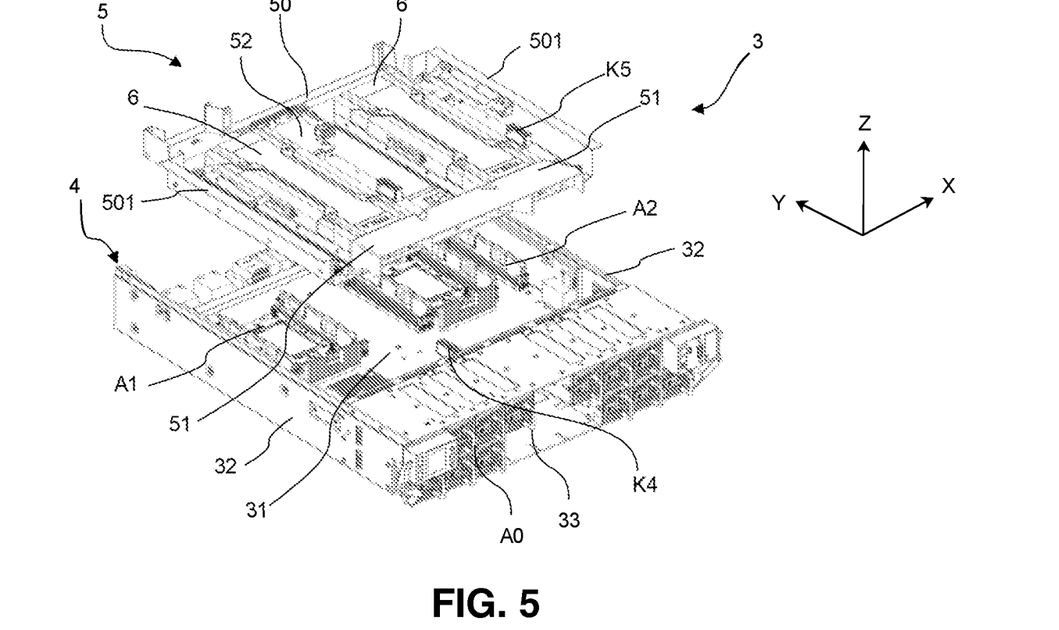
FIG. 5 is an isometric view of the internal body with the top tray disengaged from the bottom tray, according to one or more embodiments of the invention.

As represented in FIG. 5, according to one or more embodiments, the internal body 3 comprises a bottom tray 4 and a top tray 5 which is releasably coupled with the bottom tray 4.

According to FIG. 5, by way of at least one embodiment, the bottom tray 4 comprises several bottom secondary components A0-A3. In at least one embodiment, the bottom secondary electronic components are in the form of fans A0, processor cooler A1, Dual In-Line Memory Module (DIMM) A2, etc. The fans A0 are located at the front so that air can flow from the front to the rear in the computing unit 1. In at least one embodiment, the internal body 3 comprises a front housing 33 in order to receive an interconnecting module (not represented) configured to interconnect several computing units together. The bottom tray 4 comprises a bottom wall 31 for supporting the secondary electronic components A0-A3 and side walls 32. As it will be presented in details later, by way of one or more embodiments, the bottom tray 4 comprises at least a bottom connector K4 connected to the bottom secondary electronic components A0-A3. In at least one embodiment, the bottom connector K4 extends vertically to the top.

The top tray 5 comprises ventilation ducts 51 so that fresh air, coming from the front fans A0, can be guided to the rear of the computing unit 1 (to the primary components C1).

As illustrated in FIG. 5, in one or more embodiments, the top tray 5 comprises a supporting wall 50, having a U-shape, and two lateral holding walls 501, extending in a (X,Y) plane, configured to vertically abut with the side walls 32 of the internal body 3/bottom tray 4. The top tray 5 covers almost completely the bottom tray 4. The top tray 5 comprises two ventilation ducts 51 configured to guide the air flow from the fans A0 to the rear of the computing unit 1.

Figure 6:
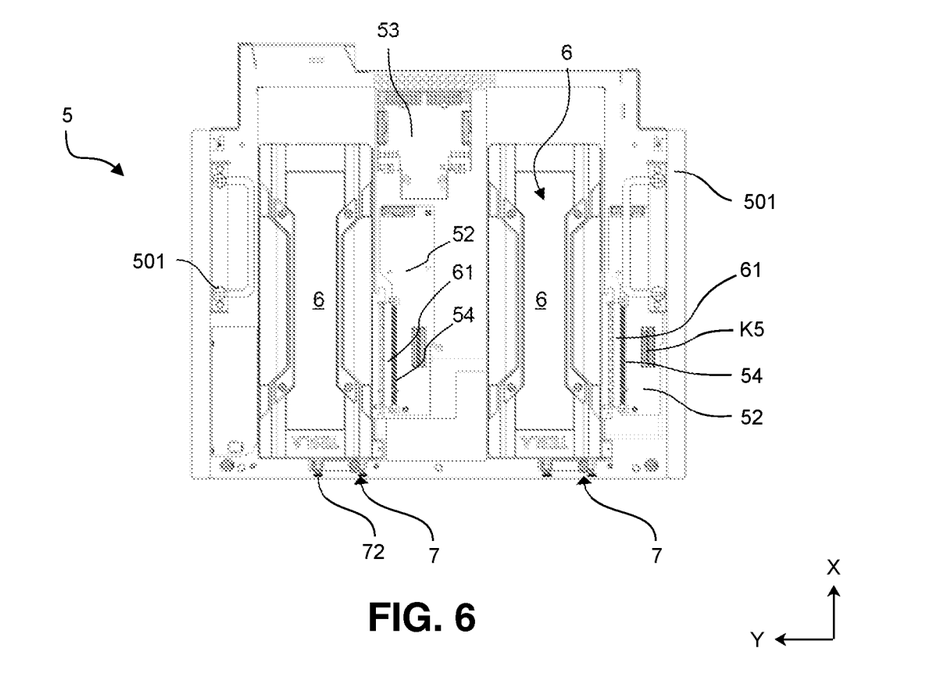
FIG. 6 is a top view of the top tray, according to one or more embodiments of the invention.

According to at least one embodiment of the invention, as illustrated in FIG. 5, the top tray 5 comprises top secondary electronic components. As represented in FIG. 6, according to one or more embodiments, the top tray 5 comprises two expansions cards 6 having, preferably, a Full-Length Full Height format (FLFH format). In at least one embodiment, each expansion card 6 comprises a GPU (Graphical Processing Unit). The top tray 5 comprises also several interface cards, particularly, one connection card 52 for each expansion card 6 and a central card 53 for connecting the connection cards 52. The expansions cards 6 and the interface cards 52, 53 are top secondary electronic components.

The top tray 5 comprises at least a top connector K5 connected to the top secondary electronic components 6, 52, 53, the top connector K5 being configured to cooperate with the bottom connector K4 of the bottom tray 4 when the top tray 5 is coupled with the bottom tray 4. In at least one embodiment, the top connector K5 belongs to the central card 53 but it could be different.

The top tray 5 is releasably coupled with the bottom tray 4 so that a customer can replace directly the expansion cards 6 without having to remove entirely the internal body 2 from the HPC cabinet. In at least one embodiment, the top connector K5 is connected to the bottom connector K4 by a flexible cable (not represented) but the top connector K5 could also be fitted directly to the bottom connector K4.

According to one or more embodiments of the invention, the top tray 5 is used to guide the air flow but also to mount large components which require heavy cooling, such as GPU.

As represented in FIG. 6, by way of at least one embodiment, each expansion card 6 extends longitudinally along the X axis and comprises a lateral connector 61. Each connection card 52 comprises a lateral socket 54, preferably a PCIe connector, configured to cooperate with the lateral connector 61. In other words, in one or more embodiments, when connecting/disconnecting an expansion card 6, said expansion card 6 has to be moved along the Y axis relatively to the connection card 52 in order to avoid damaging the pins of the lateral connector 61.

Figure 7:
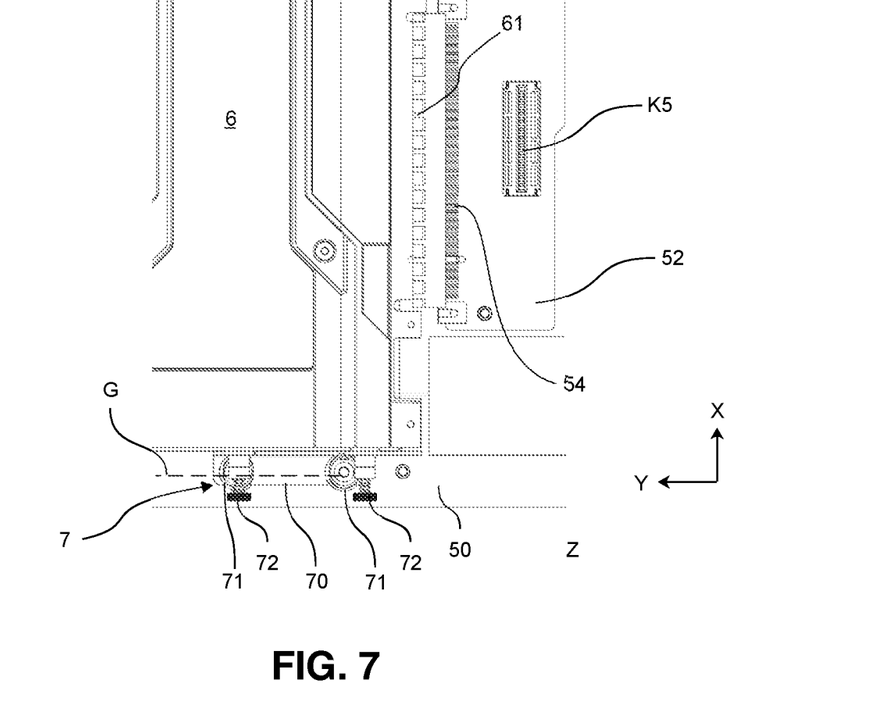
FIG. 7 is a zoom view from the top of the connecting mechanism of FIG. 6, according to one or more embodiments of the invention.

The top tray 5 comprises a fastening system 7, independent from the lateral socket 54, coupling mechanically the expansion card 6 to the top tray 5. The fastening system 7 is configured to guide the expansion card 6 during connection/disconnection along a guiding path formed in the top tray 5. To this end, as illustrated in FIG. 7 according to one or more embodiments of the invention, the guiding path comprises a lateral slot G which extends along the Y axis. The length of the lateral slot G is comprised preferably between 8 and 12 mm to allow disconnection.

Figure 8:
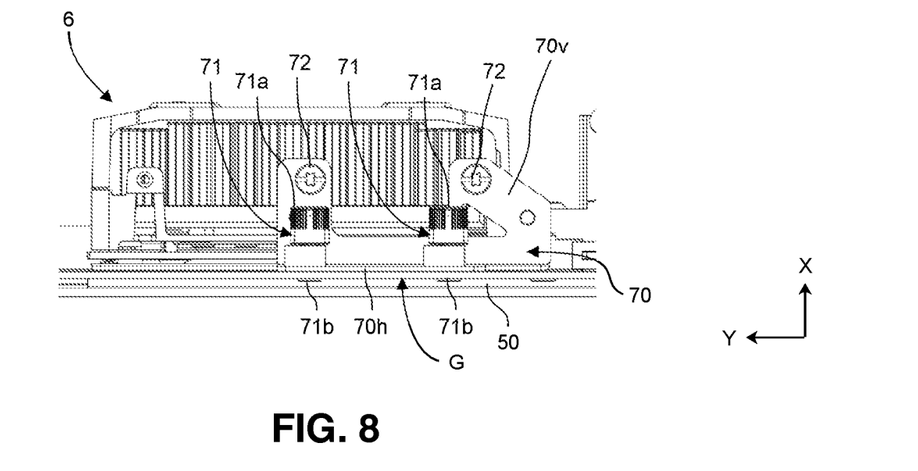
FIG. 8 is a zoom view from the front of the connecting mechanism of FIG. 6, according to one or more embodiments of the invention.
Figure 9:
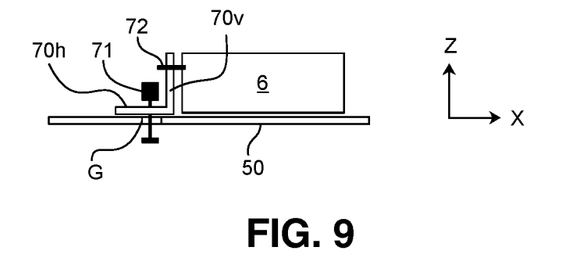
FIG. 9 is a schematic front view of the expansion card when connected, according to one or more embodiments of the invention.

According to FIGS. 7 and 8, by way of at least one embodiment, the fastening system 7 comprises a supporting frame 70 fixed to the expansion card 6 and at least one fastening member 71, mounted onto the supporting frame 70, for locking the expansion card 6 with the top tray 5, preferably two. In at least one embodiment, as represented in FIG. 8, the supporting frame 70 is L-shaped and comprises a horizontal portion 70h, configured to cooperate with the top tray 5, and a vertical portion 70v, configured to cooperate with the expansion card 6. The fastening system 7 comprises locking members 72, preferably screws of thumbscrews, which are locking the vertical portion 70v to the expansion card 6.

In at least one embodiment, each fastening member 71 is a thumbscrew so that a customer can use the fastening system 7 without any tool. Each fastening member 71 comprises a head portion 71a which can be rotated by hand by a customer without any tool and a foot portion 71b which can cooperate with the lateral slot G. Depending on the orientation of the fastening members 71, the foot portion 71b can be tighten to the top tray 5 or free to move in the lateral slot G. In one or more embodiments, a portion of the lateral slot G is wider so that the expansion card 6 can be removed vertically when the expansion card 6 has been sufficiently guided away from the lateral socket 54 of the connection card 52.

It will now be described a method for removing an expansion card 6 connected to an interface card, here a connection card 52, on the top tray 5, according to one or more embodiments. In the initial position, the internal body 3 is located in the housing H1 of the external body 2 (see FIG. 3). As illustrated in FIG. 4, in at least one embodiment, the user then pulls the internal body 3 out from the external body 2. The user then lifts the top tray 5 from the bottom tray 4 so that the top tray 5 can be easily accessible. The top connector K5 of the top tray 5 is disconnected manually or automatically from the bottom connector K4 of the bottom tray 4.

Figure 10:
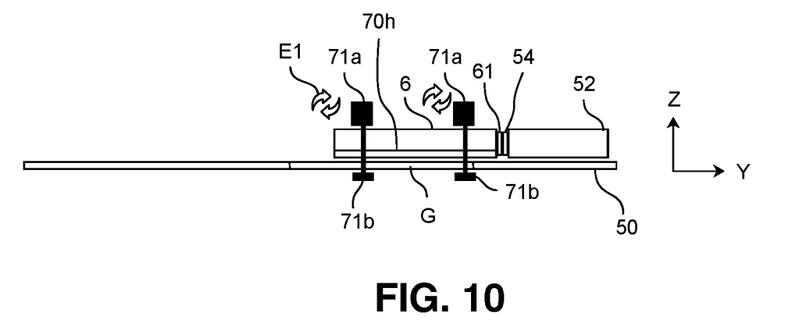
FIG. 10 is a schematic front view of the top tray when the expansion card has been removed, according to one or more embodiments of the invention.

If the user wants to remove an expansion card 6 mounted in the top tray 5, the user firstly unlocks (E1) (FIG. 10) the expansion card 6 from the top tray 5 by manually rotating the head portion 71a of the fastening members 71 so that the expansion card 6 is freed from the supporting wall 50.

Figure 11:
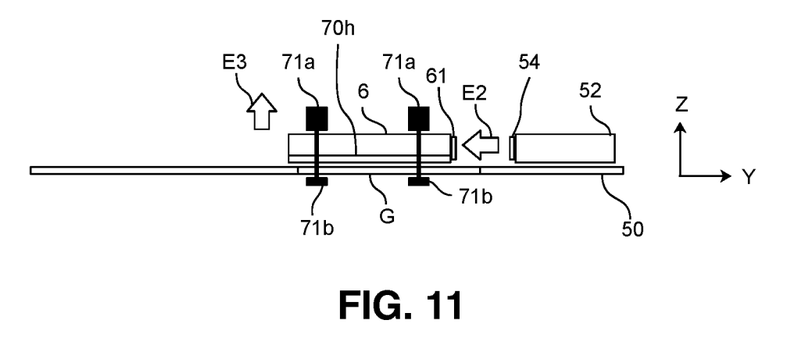
FIG. 11 is a schematic front view of the expansion card when removed, according to one or more embodiments of the invention.
Figure 12:
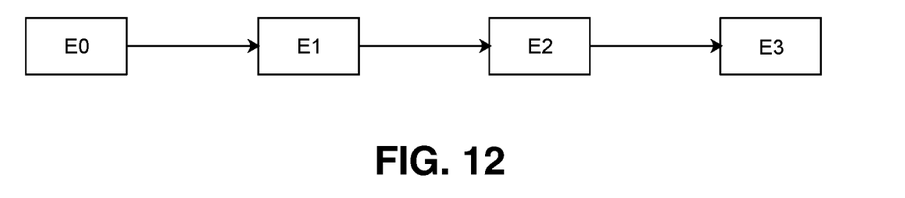
FIG. 12 is a schematic diagram of the method for disconnecting an expansion card, according to one or more embodiments of the invention.

Then, the expansion card 6 can be laterally moved (E2) to the left by guiding the foot portion 71b of the fastening members 71 within the lateral slot G so that the expansion card connector 61 can disconnect properly from the lateral socket 54 of the connection card 52. The lateral sliding allows to avoid damaging the pins of the lateral connector 61. Then, the expansion card can be removed (E3) vertically without any damage (FIG. 11). The steps are represented schematically in FIG. 12.

If needed, by way of at least one embodiment, the supporting frame 70 is removed from the old expansion card by acting on the locking members 72 and mounted onto a new expansion card. Advantageously, the fastening systems 7 can also guide the expansion card 6 during the connection.

All terminologies used herein are for purposes of describing embodiments and examples and should not be construed as limiting the invention. As used herein, the singular forms "a," "an," and "the" are configured to include the plural forms as well, unless the context clearly indicates otherwise. Furthermore, to the extent that the terms "including," "includes," "having," "has," "with," or variants thereof, are used in either the detailed description and/or the claims, such terms are configured to be inclusive in a manner similar to the term "comprising."

Unless otherwise defined, all terms (including technical and scientific terms) used herein have the same meaning as commonly understood by the person skilled in the art to which this invention belongs. Furthermore, terms, such as those defined in commonly used dictionaries, should be interpreted as having a meaning that is consistent with their meaning in the context of the relevant art and will not be interpreted in an idealized or overly formal sense unless expressly defined herein.

While aspects of the invention have been particularly shown and described with reference to the embodiments above, it will be understood by those skilled in the art that various additional embodiments may be contemplated by the modification of the disclosed methods without departing from the spirit and scope of what is disclosed. Such embodiments should be understood to fall within the scope of the invention as determined based upon the claims and any equivalents thereof.

The invention claimed is:

1. A computing unit configured to be mounted in a High-Performance Computing (HPC) cabinet, defining a plurality of vertically stacked sockets, the computing unit comprising:
    an external body, comprising primary electronic components, configured to engage with at least one of the plurality of vertically stacked sockets,
        wherein the external body further comprises at least a bottom wall and two lateral walls defining a housing that is opened from a front of the housing,
        wherein each lateral side of the two lateral walls comprises an abutment wall configured to be secured directly to the HPC cabinet,
        wherein the external body comprises at least a first connector connected to the primary electronic components,
    an internal body comprising secondary electronic components, wherein the internal body is releasably coupled with the external body in order to allow extraction of the internal body when the external body is secured fixedly to the HPC cabinet,
        wherein the internal body further comprises
            at least a second connector connected to the secondary electronic components,
                wherein the second connector is configured to cooperate with the first connector when the internal body is coupled with the external body,
            a bottom tray, comprising bottom secondary electronic components and at least a bottom connector connected to the bottom secondary electronic components,
            a top tray being releasably coupled with the bottom tray,
                wherein the top tray comprises top secondary electronic components and at least a top connector connected to the top secondary electronic components,
                wherein the top connector is configured to cooperate with the bottom connector when the top tray is coupled with the bottom tray.

2. The computing unit according to claim 1, wherein at least one of the top secondary electronic components is an expansion card, extending longitudinally in the computing unit from a front of the computing unit to a rear of the computing unit, and another one of the top secondary electronic components is an interface card connected to the top connector, wherein the expansion card is connected to the interface card via a lateral connection.

3. The computing unit according to claim 2, wherein the top tray further comprises a fastening system, independent from the lateral connection, mechanically coupling the expansion card to the top tray.

4. The computing unit according to claim 3, wherein the fastening system is configured to guide the expansion card relatively to the interface card along a guiding path formed in the top tray.

5. The computing unit according to claim 4, wherein the guiding path comprises at least a lateral slot.

6. The computing unit according to claim 3, wherein the fastening system comprises at least one fastening member for locking the expansion card with the top tray.

7. The computing unit according to claim 6, wherein the at least one fastening member is a thumbscrew.

8. The computing unit according to claim 3, wherein the fastening system comprises at least a supporting frame comprising a horizontal portion configured to cooperate with the top tray, and a vertical portion configured to cooperate with the expansion card.

9. The computing unit according to claim 8, wherein the fastening system further comprises locking members that lock the vertical portion to the expansion card.

10. The computing unit according to claim 2, wherein the expansion card comprises a Full-Length Full Height format.

11. The computing unit according to claim 2, wherein the expansion card is connected to the interface card via a lateral PCIe connection.

12. The computing unit according to claim 2, wherein at least two of the top secondary electronic components is an expansion card such that said computing unit further comprises at least two expansion cards.

13. A method for removing an expansion card from a top tray of an internal body of a computing unit configured to be mounted in a High-Performance Computing (HPC) cabinet, defining a plurality of vertically stacked sockets,
wherein the computing unit comprises
an external body, comprising primary electronic components, configured to engage with at least one of the plurality of vertically stacked sockets,
wherein the external body further comprises at least a bottom wall and two lateral walls defining a housing that is opened from a front of the housing,
wherein each lateral side of the two lateral walls comprises an abutment wall configured to be secured directly to the HPC cabinet,
wherein the external body comprises at least a first connector connected to the primary electronic components,
the internal body comprising secondary electronic components, wherein the internal body is releasably coupled with the external body in order to allow extraction of the internal body when the external body is secured fixedly to the HPC cabinet,
wherein the internal body further comprises
at least a second connector connected to the secondary electronic components,
wherein the second connector is configured to cooperate with the first connector when the internal body is coupled with the external body,
a bottom tray, comprising bottom secondary electronic components and at least a bottom connector connected to the bottom secondary electronic components,
the top tray being releasably coupled with the bottom tray,
wherein the top tray comprises top secondary electronic components and at least a top connector connected to the top secondary electronic components,
wherein the top connector is configured to cooperate with the bottom connector when the top tray is coupled with the bottom tray,
wherein at least one of the top secondary electronic components is an expansion card, extending longitudinally in the computing unit from a front of the computing unit to a rear of the computing unit, and another one of the top secondary electronic components is an interface card connected to the top connector,
wherein the expansion card is connected to the interface card via a lateral connection,
wherein the top tray further comprises a fastening system, independent from the lateral connection, mechanically coupling the expansion card to the top tray,
the method comprising:
pulling the internal body out from the housing of the external body,
unlocking the fastening system,
laterally moving with guidance the expansion card away from the interface card, and
vertically removing the expansion card.

\* \* \* \* \*